United States Patent
Takaki et al.

(10) Patent No.: US 8,204,093 B2
(45) Date of Patent: Jun. 19, 2012

(54) METHOD OF MANUFACTURING VERTICAL-CAVITY SURFACE EMITTING LASER AND VERTICAL-CAVITY SURFACE EMITTING LASER ARRAY

(75) Inventors: Keishi Takaki, Tokyo (JP); Norihiro Iwai, Tokyo (JP); Koji Hiraiwa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 12/560,860

(22) Filed: Sep. 16, 2009

(65) Prior Publication Data

US 2011/0064108 A1  Mar. 17, 2011

(51) Int. Cl.
*H01S 5/10* (2006.01)
*H01S 5/183* (2006.01)
(52) U.S. Cl. ............... 372/50.124; 372/46.013; 372/98
(58) Field of Classification Search ............ 372/46.013, 372/50.124, 98, 46.13
See application file for complete search history.

(56) References Cited

U.S. PATENT DOCUMENTS

| | | | |
|---|---|---|---|
| 6,046,065 A * | 4/2000 | Goldstein et al. | 438/46 |
| 6,169,756 B1 * | 1/2001 | Chirovsky et al. | 372/46.015 |
| 6,750,071 B2 * | 6/2004 | Chirovsky et al. | 438/22 |
| 6,916,672 B2 | 7/2005 | Chirovsky et al. | |
| 2004/0151221 A1 * | 8/2004 | Yamamoto et al. | 372/32 |

* cited by examiner

*Primary Examiner* — Jessica Stultz
*Assistant Examiner* — Michael Carter
(74) *Attorney, Agent, or Firm* — Turocy & Watson, LLP

(57) ABSTRACT

A method of manufacturing a surface emitting laser element of a vertical cavity type comprises sequential accumulation that accumulates a reflecting mirror of a multilayered film layer at a lower side of the substrate, and accumulates semiconductor layers onto the reflecting minor at the lower side that comprises an active layer and a contact layer. The process includes forming a first layer of dielectric substance on the contact layer, forming an electrode of an annular shape on the contact layer that has an open part to be arranged for the first layer at an inner side of the open part, and forming a second layer of dielectric substance to cover the first layer and a gap formed between the first layer and the electrode of the annular shape. The accumulated semiconductor layers are etched to form a mesa post, using the electrode of the annular shape as a mask.

9 Claims, 10 Drawing Sheets

METHOD OF MANUFACTURING VERTICAL-CAVITY SURFACE EMITTING LASER AND VERTICAL-CAVITY SURFACE EMITTING LASER ARRAY

BACKGROUND OF THE INVENTION

1. Field of the Invention

The present invention relates to a method of manufacturing a surface emitting laser element of a vertical cavity type and relates to the surface emitting laser element of the vertical cavity type.

2. Description of the Related Art

Conventional surface emitting laser elements of the vertical cavity type include a plurality of accumulated semiconductor layers. The semiconductor layers include active layers between a reflecting mirror (e.g., a distributed Braggs reflector (DBR)) on the upper side of the semiconductor layers and a reflecting mirror (e.g., a DBR mirror) on the lower side of the semiconductor layers. Moreover, the conventional surface emitting laser elements of the vertical cavity type have the structure of a mesa post and an electrical current narrowing layer in order to control the electrical current path and to enhance the efficiency of the electrical current injection. Further, the electrical current narrowing layers include an electrical current narrowing part that is located at the outer circumference and that is formed of $Al_2O_3$, and comprises the electrical current injection part of a round shape that is located at the center of each of the electrical current narrowing parts and that is formed of AlAs. Still further, the electrical current injection parts are the electrical current path in the case where the electrical current is injected into the surface emitting laser element of the vertical cavity type, and the open part allows the laser beam to flow out.

Still further, each of the conventional surface emitting laser elements of the vertical cavity type have the layer for the electrical current path that has lower resistance and that is formed of the semiconductor is a ($p^+$) type at each of the corresponding predetermined locations for each of the corresponding top layers among the plurality of semiconductor layers and between each of the corresponding top layers and each of the corresponding electrical current narrowing layers respectively, in order to perform the injection of the electrical current efficiently from each of the corresponding electrodes of the annular shape at the (p) side. The electrical current that is injected from the electrode of the annular shape at the (p) side thereof is efficiently injected into the active layer via the electrical current narrowing layer by passing through the corresponding layers for the electrical current path. As a result, it threshold electrical current for emission from each of the surface emitting laser elements of the vertical cavity type is reduced. Still further, each of the layers for the electrical current path at each of the top layers of the layers of the semiconductor function as the contact layer that corresponds to each of the electrodes of the annular shape at the (p) side, the "contact layer".

Light that has a predetermined wavelength for a laser oscillation forms a standing wave at between the two reflecting mirrors in accordance with a surface emitting laser elements of a vertical cavity type. When a standing wave to be formed within the surface emitting laser elements, the standing wave forms a loop between the two mirrors. Still further, the electrical current narrowing layer, the contact layer and the layer for the electrical current path, that are described above, are individual layers designed with a higher priority regarding each of the electrical characteristics so that a laser beam can be absorbed and/or scattered and arranged as a node for a standing wave of light. And the thickness and the index of refraction of each of the layers within the conventional surface emitting laser element can be controlled in order to realize each of the locations of the loop and the node for the standing wave of the light that are described above.

Still further, the conventional surface emitting laser elements of the vertical cavity type that are individually include a re-phase layer on the surface of the contact layer at the inner side of the open part of the electrode of the annular shape at the (p) side. Still further, each of the re-phase layers can formed of the dielectric substance, such as silicon nitride or the like. The re-phase layer can be inserted between the contact layer and the bottom reflecting mirror. Furthermore, the optical thickness can be adjusted to be approximately $\lambda/4$, in order to locate each of the contact layers at the node of the standing wave, and each of the corresponding bottom surfaces of the reflecting at the loop of the standing wave. An optical thickness of a layer is expressed by a product of a layer thickness and an index of refraction of the layer.

[Patent Document 1] The U.S. Pat. No. 6,916,672
[Patent Document 2] The U.S. Pat. No. 6,750,071

However, conventional surface emitting laser elements of the vertical cavity type have an increased a threshold electrical current for emission comparing to a design value for the threshold electrical current due to an increased resistance of the element.

Here FIG. 10 is a cross sectional view of a principal part of an exemplary conventional surface emitting laser element of a vertical cavity type. And as shown in FIG. 10, a surface emitting laser element of a vertical cavity type (300) comprises a configuration of: an electrical current narrowing layer (307) that comprises an electrical current narrowing part (307a) which is designed to be located at an outer circumference, and an electrical current injection part (307b) of a round shape which is designed to be located at a center of the electrical current narrowing part (307a); a spacer layer of a (p) type (309); a layer for an electrical current path of a ($p^+$) type (310); another spacer layer of a (p) type (311); and a contact layer of a ($p^+$) type (312), that are accumulated in order one after the other. Moreover, an electrode of an annular shape at a (p) side is formed on the contact layer of the ($p^+$) type (312), and a disk shaped layer for a phase adjustment (314) is formed of a silicon nitride at an inner side of an open part of the electrode of the annular shape at the (p) side (313). Further, an upper DBR mirror (316) is formed on the electrode of the annular shape at the (p) side (313) and on the layer for the phase adjustment (314), comprising a multilayered film layer of a dielectric substance. Still further, an active layer is located at a lower part of the electrical current narrowing layer (307). Furthermore, from the active layer through the contact layer of the ($p^+$) type (312) has a configuration of mesa post as a post shape.

A gap (321) that has a width of approximately between 0.3 μm and 0.5 μm is formed all over an outer circumference of the layer for the phase adjustment (314) between the outer circumference of the layer for the phase adjustment (314) and an internal circumference of the electrode of the annular shape at the (p) side (313). Moreover, a gutter (324) is formed on the contract layer of the ($p^+$) type (312) directly under such the gap (321). The gutter (324) is formed when the mesa post is formed in the surface emitting laser element of the vertical cavity type (300) due to a trespass of an etching reagent between the outer circumference of the layer for the phase adjustment (314) and the internal circumference of the electrode of the annular shape at the (p) side (313) and then due to an occurrence of erosion of the contract layer of the ($p^+$) type (312). Moreover, in such a case where the gutter (324) is formed, the contract layer of the (p⁺) type (312) has a thinner layer thickness or a rupture and a higher electrical resistance. As a result, the electrical current which is injected from the electrode of the annular shape at the (p) side (313) flows in a direction to a face in the electrical current path of the (p⁺) type (310) as arrowed with making use of an (Ar3) therein in place of flowing in a direction to the contract layer of the (p⁺) type (312), leading to an increased resistance of the element.

An objective is to provide a method of manufacturing a surface emitting laser element of a vertical cavity type and another objective is to provide the surface emitting laser element of the vertical cavity type with a lower threshold electrical current for emission.

SUMMARY OF THE INVENTION

According to a first aspect of the present invention, a method of manufacturing a surface emitting laser element of a vertical cavity type comprises the steps of: applying a process of accumulations on a substrate, the process sequentially including accumulating a reflecting mirror of a multilayered film layer at a lower side on to the substrate, and accumulating layers of a semiconductor as a plurality on to the reflecting mirror of the multilayered film layer at the lower side, that comprises an active layer and that further comprises a contact layer at a top layer; forming a first layer of a dielectric substance as a process of a formation of the first layer of the dielectric substance at a part of regions on the contact layer; forming an electrode of an annular shape as a process of a formation of the electrode of the annular shape on the contact layer, that has an open part at a center, in order to be arranged for the first layer of the dielectric substance at an inner side of the open part; forming a second layer of a dielectric substance as a process of a formation of the second layer of the dielectric substance in order to cover the first layer of the dielectric substance and to cover a gap which is formed between the first layer of the dielectric substance and the electrode of the annular shape; and etching the layers of the semiconductor as a process of a formation of a mesa post that are accumulated, thereby etching to be a shape of the mesa post using the electrode of the annular shape as a mask.

According to a second aspect of the present invention, the method of manufacturing the surface emitting laser element of the vertical cavity type in the first aspect comprises the additional step of: forming a reflecting mirror of a multilayered film layer at an upper side on to the second layer of the dielectric substance, that is formed of a dielectric substance, as a process of a formation of the reflecting mirror of the multilayered film layer at the upper side after performing the process of the formation of the mesa post, in which the first layer of the dielectric substance and the second layer of the dielectric substance are formed with a total optical thickness of approximately λ/4 where (λ) is a preferred emission wavelength of a laser.

According to a third aspect of the present invention, the method of manufacturing the surface emitting laser element of the vertical cavity type in the first aspect comprises the additional step of: forming a reflecting mirror of a multilayered film layer at an upper side as a process of a formation of the reflecting mirror of the multilayered film layer at the upper side by performing an accumulation of the multilayered film layer at the upper side, that is formed of a dielectric substance, that is comprised of the multilayered film layer at the upper side and the second layer of the dielectric substance, and a layer of a dielectric substance at an upper side is a bottom layer, on the second layer of the dielectric substance after performing the process of the formation of the mesa post, wherein the first layer of the dielectric substance is formed to comprise a multilayered structure of a layer of a dielectric substance at a lower side and the layer of the dielectric substance at the upper side, and so the dielectric substance at the lower side has an optical thickness of approximately λ/4 where (λ) is a preferred emission wavelength of a laser.

Still further, according to a fourth aspect of the present invention, the method of manufacturing the surface emitting laser element of the vertical cavity type in any one of the first to the third aspects is characterized in that the process of the accumulations includes a process of an accumulation of a layer to be oxidized in order to accumulate the layer to be oxidized that is formed of an AlAs or an $Al_{1-x}Ga_xAs$ (0<x<1) for between the contact layer and the active layer, and the same includes a process of a formation of an electrical current narrowing layer in order to form the electrical current narrowing layer that comprises an electrical current injection part which is formed of the AlAs or the $Al_{1-x}Ga_xAs$ and that comprises an electrical current narrowing part which is formed of an $Al_2O_3$ or an $(Al_{1-x}Ga_x)_2O_3$, by performing a process of a selective oxidizing heat treatment for the layer to be oxidized that is performed the accumulation, after performing the process of the formation of the mesa post.

Still further, according to a fifth aspect of the present invention, the method of manufacturing the surface emitting laser element of the vertical cavity type in the fourth aspect is characterized in that the process of the accumulations includes a process of an accumulation of a layer for an electrical current path in order to accumulate the layer for the electrical current path between the contact layer and the layer to be oxidized, that has a concentration of an acceptor which is approximately equivalent to that in the contact layer.

Still further, according to a sixth aspect of the present invention, the method of manufacturing the surface emitting laser element of the vertical cavity type according to in any one of the first to the third aspects is characterized in that at least a part of the first layer of the dielectric substance that is contacting to the contact layer is formed of a silicon nitride which has a composition ratio of nitrogen to be higher comparing to a stoichiometric composition.

According to a seventh aspect of the present invention, a surface emitting laser element of the vertical cavity type comprises: a substrate; a reflecting mirror of a multilayered film layer at a lower side that is accumulated on the substrate; a plurality of layers of a semiconductor that are accumulated on the reflecting mirror of the multilayered film layer at the lower side, that comprises a structure of a mesa post, and that comprises an active layer and that further comprises a contact layer at a top layer; an electrode of an annular shape that is formed on the contact layer, that has an open part at a center, and that has an outer circumference which corresponds to an outer circumference of the structure of the mesa post; a first layer of a dielectric substance at an inner side of the open part of the electrode of the annular shape on the contact layer; and a second layer of a dielectric substance in order to cover the first layer of the dielectric substance and to cover a gap which is formed between the first layer of the dielectric substance and the electrode of the annular shape.

Still further, according to an eighth aspect of the present invention, the surface emitting laser element of the vertical cavity type in the seventh aspect further comprises: a reflecting mirror at an upper side of a multilayered film layer, that is formed on the second layer of the dielectric substance, and that is formed of a dielectric substance, wherein the first layer of the dielectric substance and for the second layer of the dielectric substance has a total optical thickness of approximately λ/4 where a preferred emission wavelength of a laser is (λ).

According to a ninth aspect of the present invention, the surface emitting laser element of the vertical cavity type in the seventh aspect further comprises: a multilayered film layer at an upper side, that is formed on the second layer of the dielectric substance, and that is formed of a dielectric substance, wherein the first layer of the dielectric substance comprises a multilayered structure of a layer of a dielectric substance at a lower side and a layer of a dielectric substance at an upper side, and the layer of the dielectric substance at the lower side has an optical thickness of approximately λ/4 in a case where a preferred emission wavelength of a laser is assumed to be (λ), and the multilayered film layer at the upper side and the second layer of the dielectric substance and the layer of the dielectric substance at the upper side configure a reflecting mirror of a multilayered film layer at an upper side, in which the layer of the dielectric substance at the upper side is a bottom layer.

Still further, according to a tenth aspect of the present invention, the surface emitting laser element of the vertical cavity type in any one of the seventh to the ninth aspects is characterized in that there is designed for the layers of the semiconductor as a plurality thereof to provide an electrical current narrowing layer that comprises an electrical current injection part which is formed of an AlAs or an $Al_{1-x}Ga_xAs$ (0<x<1) and that comprises an electrical current narrowing part which is formed of an $Al_2O_3$ or an $(Al_{1-x}Ga_x)_2O_3$, that are formed by performing a process of a selective oxidizing heat treatment for between the active layer and the contact layer.

Still further, according to an eleventh aspect of the present invention, the surface emitting laser element of said vertical cavity type in the tenth aspect is characterized in that the plurality of layers of the semiconductor provide a layer for an electrical current path between the electrical current narrowing layer and the contact layer, that has a concentration of an acceptor which is approximately equivalent to that in the contact layer.

Still further, according to a twelfth aspect of the present invention, the surface emitting laser element of the vertical cavity type in any one of the seventh to the ninth aspects is characterized in that at least a part of the first layer of the dielectric substance that is contacting to the contact layer is formed of a silicon nitride which has a composition ratio of nitrogen to be higher comparing to a stoichiometric composition.

Furthermore, according to a thirteenth aspect of the present invention, the surface emitting laser element of the vertical cavity type in any one of the seventh to the ninth aspects is characterized in that there is designed for the contact layer to have a thickness as not thicker than 50 nm, the concentration of the acceptor as not lower than $10^{19}$ cm$^{-3}$, and a concentration of hydrogen as not higher than $10^{18}$ cm$^{-3}$.

And therefore in accordance with the present invention, the surface emitting laser element of the vertical cavity type that has a lower threshold electrical current for emission, because there no gutter is formed on the contract layer at the part directly under the gap which is formed at between the first layer of the dielectric substance and the electrode of the annular shape, and then because it becomes able to prevent from an increase of a resistance of the element.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Various embodiments will be described in detailed below with reference to the drawings. However, the embodiments are meant as merely exemplary and not limiting in any way.

The First Embodiment

A surface emitting laser element of a vertical cavity type regarding the first embodiment in accordance with the present invention will be described in detail below. The surface emitting laser element of the vertical cavity type in accordance with the present first embodiment has an emission wavelength of a laser in a band of 1100 nm. Moreover, the surface emitting laser element of the vertical cavity type of the first embodiment has a first layer of a dielectric substance and a second layer of a dielectric substance with an optical thickness in total of approximately λ/4 in a case where the emission wavelength of the laser is assumed to be (λ).

Figure 1:
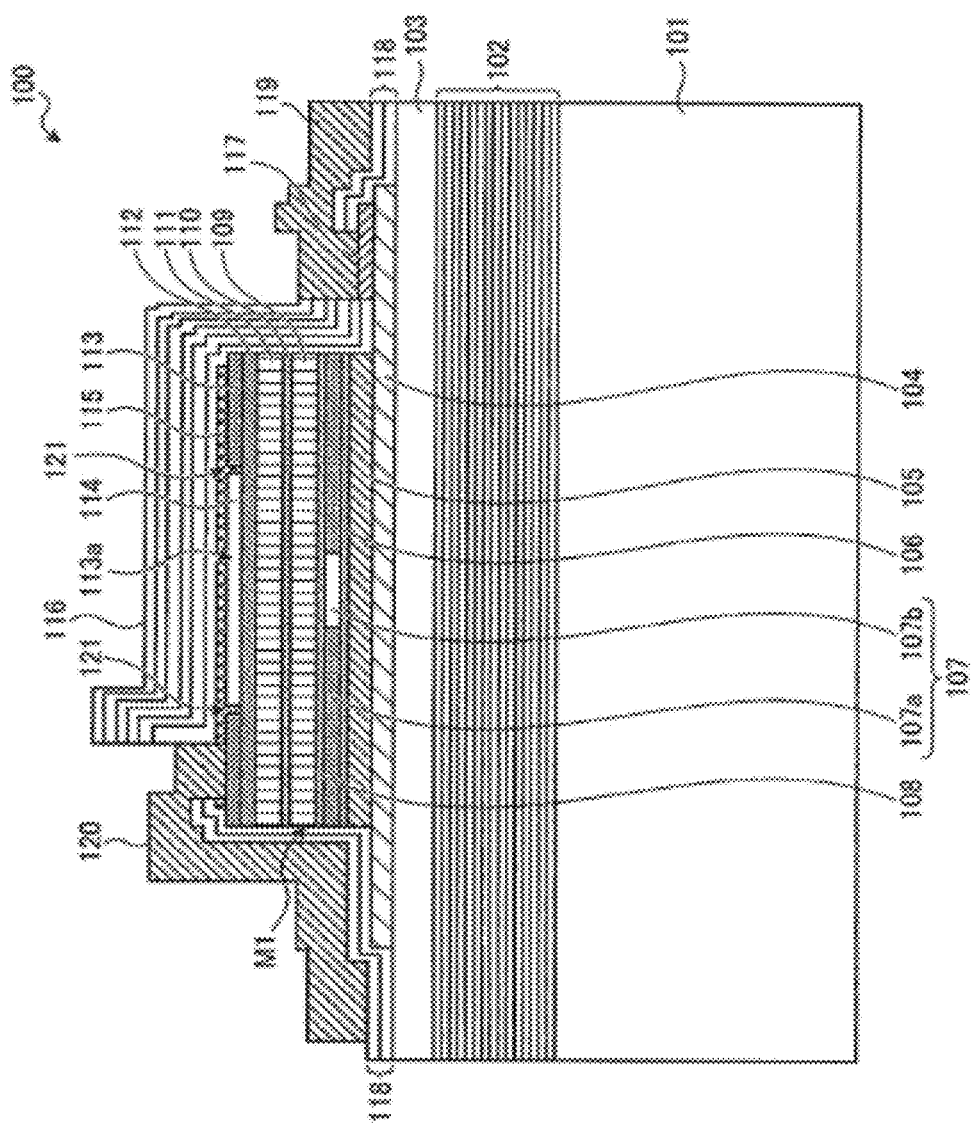
FIG. 1 is an exemplary cross sectional view of a surface emitting laser element of a vertical cavity type regarding in accordance with the first embodiment in accordance with the present invention.

FIG. 1 is a cross sectional view showing an exemplary surface emitting laser element of a vertical cavity type (100) in accordance with the present first embodiment. The surface emitting laser element of the vertical cavity type (100) comprises a substrate (101); a DBR mirror at a lower side (102) as a reflecting mirror of a multilayered film layer at the lower side that is accumulated on the substrate (101); a buffer layer (103); a contact layer of an (n) type (104); an active layer (105) that comprises a multiple quantum well structure; a layer of composition inclined at a lower side (106); an electrical current narrowing layer (107) that comprises an electrical current narrowing part (107a) which is designed to be located at an outer circumference, and an electrical current injection part (107b) as a round shape which is designed to be located at a center of such the electrical current narrowing part (107a); a layer of composition to be inclined at an upper side (108); a spacer layer of a (p) type (109); a layer for an electrical current path of a ($p^+$) type (110); another spacer layer of a (p) type (111); and then a contact layer of a ($p^+$) type (112), that are accumulated in order one after the other, and that are shown in FIG. 1. Moreover, each of at least from the active layer (105) through the contact layer of the ($p^+$) type (112) configure a mesa post (M1) as a post shape.

Further, the substrate (101) is formed of a undoped GaAs. Still further, the DBR mirror at the lower side (102) is comprised of layers of $GaAs/Al_{0.9}Ga_{0.1}As$ with 34 pairs thereof. Still further, the contact layer of the (n) type (104) is formed of a GaAs of an (n) type. Still further, the active layer (105) has a configuration in which three layers of a GaInNAs well and four barrier layers of a GaAs are accumulated one after the other. A bottom layer allows the barrier layers of the GaAs to function as a cladding layer of an (n) type. Still further, regarding the electrical current narrowing layer (107), the electrical current narrowing part (107a) is formed of $Al_2O_3$, the electrical current injection part (107b) has a diameter as between 6 μm and 7 μm formed of AlAs. Still further, there are designed for each of the layers of composition are inclined at the lower side thereof (106) therein and the layer of composition to be inclined at the upper side (108) and are formed of an AlGaAs, and configured in order to gradually increase a composition of As in a direction of thicknesses, as getting closer to the electrical current narrowing layer (107). Still further, there are designed for each of the spacer layer of the (p) type (109) and the other spacer layer of the (p) type (111) and the layer for the electrical current path of the ($p^+$) type (110) and the contact layer of the ($p^+$) type (112) formed of a GaAs as a (p) type with carbon doped thereinto or formed of a GaAs as a ($p^+$) type. Still further, a concentration of an acceptor or a concentration of a donor in each of the layers of the (p) type or in each of that of the (n) type are approximately $10^{18}$ $cm^{-3}$ for instance. Still further, a concentration of an acceptor in each of the layers of the ($p^+$) type is greater than or equal to approximately $10^{19}$ $cm^{-3}$ for instance. Furthermore, an index of refraction for each of the layers of the semiconductor is approximately 3.45, and each of the layers of the semiconductor are designed to be formed of the GaAs individually.

An electrode of an annular shape at a (p) side (113) is formed on the contact layer of the ($p^+$) type (112), with an open part (113a) at a center and an outer circumference, which corresponds to an outer circumference of the mesa post (M1), comprising a multilayered structure of Pt/Ti. Further, the electrode of the annular shape at the (p) side (113) has an outer diameter of, for example, approximately 30 μm. Furthermore, an open part (113a) is, for example, approximately between 11 μm and 14 μm.

Moreover, a first layer of a dielectric substance (114) as a disk shape is formed of a silicon nitride ($SiN_x$) at an inner side of the open part (113a) of the electrode of the annular shape at the (p) side (113). Furthermore, a gap (121) is formed with having a width of approximately between 0.3 μm and 0.5 μm over an outer circumference of the first layer of the dielectric substance (114) between outer circumference of the first layer of the dielectric substance (114) and an internal circumference of the electrode of the annular shape at the (p) side (113).

Moreover, a second layer of a dielectric substrate (115) is formed of an $SiN_x$ in order to cover the first layer of the dielectric substance (114) and the gap (121), and then for an outer circumference in order to reach the electrode of the annular shape at the (p) side (113).

Further, a DBR mirror at an upper side (116) is a reflecting mirror of a multilayered film layer at an upper side formed of a dielectric substance on the part from the second layer of the dielectric substrate (115) to the outer circumference of the mesa post (M1). Still further, the DBR mirror at the upper side (116) is comprised of a multilayered structure of between ten and twelve pairs of $SiN_x/SiO_2$ for instance. Or comprised of a multilayered structure of $Si/SiO_2$ or $\alpha$-$Si/Al_2O_3$ or the like with the number of the individual pairs designed in order to obtain a ratio of reflection of approximately 99% corresponding to an index of refraction of a material. Still further, the contact layer of an (n) type (104) extends from a lower part of the mesa post (M1) toward an outer side in a radial direction. An electrode at an (n) side (117) as a half annular shape is formed on a surface, and formed of a multilayered structure of such as AuGeNi/Au or the like. Still further, the electrode at the (n) side (117) has an outer diameter of approximately 82 μm and an inner diameter of approximately 42 μm. Furthermore, a passivation film layer (118) is formed of a dielectric substance, such as an $SiN_x$ or the like, at a region where there is no DBR mirror at the upper side (116) to, in order to protect a surface of the DBR mirror.

An electrode at an (n) side (119) is formed of Au in order to contact to the electrode at the (n) side (117) via an open part formed on the passivation film layer (118). Further, an electrode at a (p) side (120) is formed of Au in order to contact to the electrode of the annular shape at the (p) side (113), via the open part on the passivation film layer (118). Furthermore, each of the electrode at the (n) side (117) and the electrode of the annular shape at the (p) side (113) is electrically connected to an electrical current supply circuit that is provided at an outside and that is not shown in any of the figures, through the electrode at the (n) side (119) and the electrode at the (p) side (120).

When a voltage is applied between the electrode at the (n) side (117) and the electrode of the annular shape at the (p) side (113) from the electrical current supply circuit, via the electrode at the (n) side (119) and the electrode at the (p) side (120), and when there is injected an electrical current thereinto, the electrical current flows mainly through the contact layer of the ($p^+$) type (112) and the layer for the electrical current path of the ($p^+$) type (110) that individually have lower resistances. And then the electrical current path is narrowed into an inner side of the electrical current injection part (107b) due to the electrical current narrowing layer (107), and thereby being supplied to the active layer (105) with a higher density of the electrical current. As a result, the active layer (105) undergoes a carrier injection, and then spontaneously emits light. Further, a light with a wavelength of λ has an emission wavelength of a laser among the spontaneously emitted light and a standing wave is formed in between the DBR mirror at the lower side (102) and the DBR mirror at the upper side (116), and the active layer (105) amplifies the light. The light that forms the standing wave performs a laser oscillation when the current is higher than a value of a threshold for the current, and a laser beam having a band of 1100 nm from the open part (113a) of the electrode of the annular shape at the (p) side (113) is output.

Figure 2:
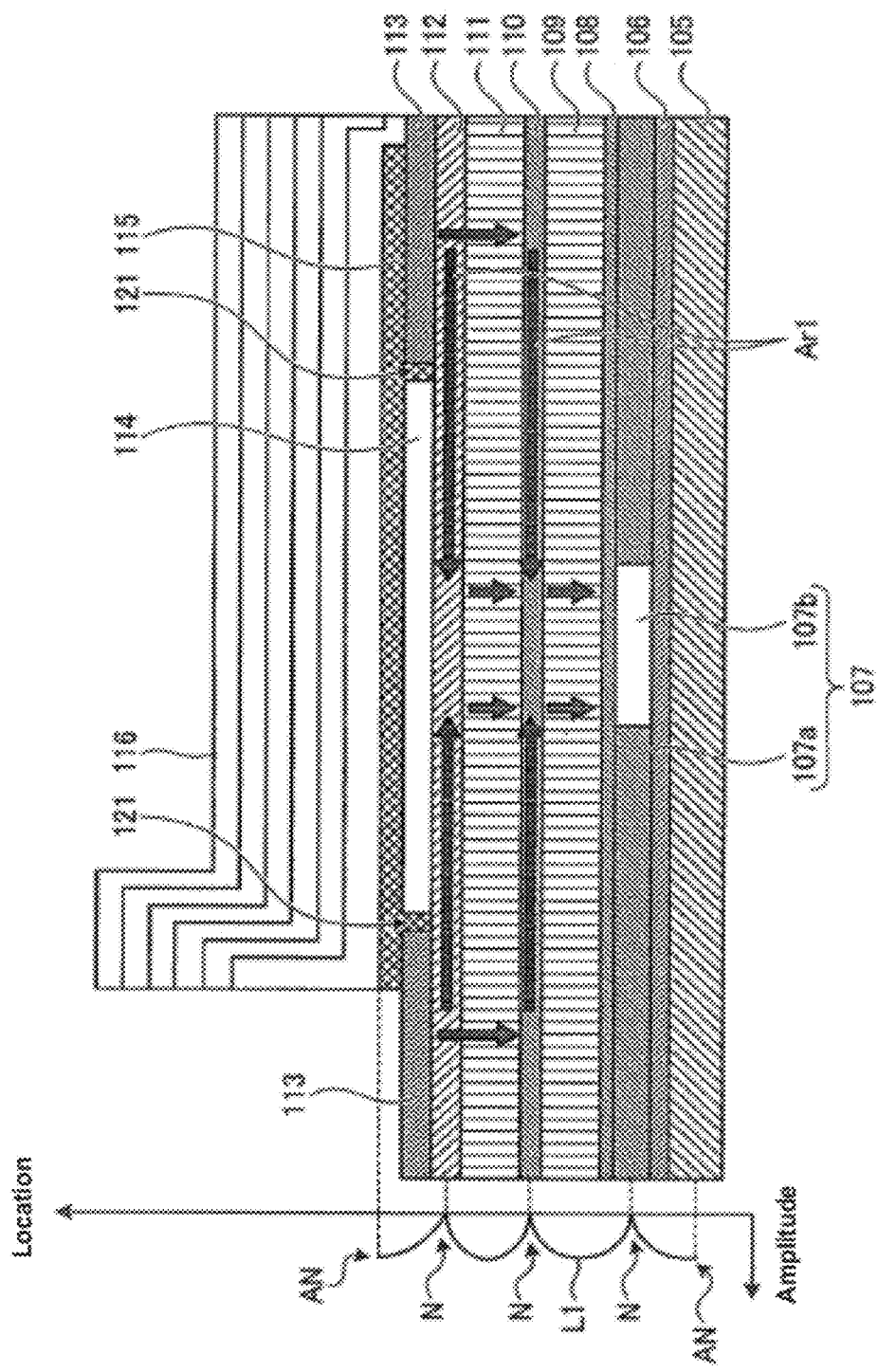
FIG. 2 is an explanatory drawing showing a standing wave of a light and an electrical current path in accordance with the surface emitting laser element of the vertical cavity type as shown in FIG. 1.

Next, the standing wave of the light and the electrical current path in accordance with the surface emitting laser element of the vertical cavity type (100) will be described in detail below. Here FIG. 2 is an explanatory drawing showing the standing wave of the light and the electrical current path in accordance with such the surface emitting laser element of the vertical cavity type (100).

First of all, the standing wave of the light in accordance with such the surface emitting laser element of the vertical cavity type (100) will be described in detail below. Here in accordance with FIG. 2, a line (L1) indicates a location in a multilayered structure from the active layer (105) through the second layer of the dielectric substance (115), and the same indicates an amplitude of the standing wave at the location therein. Moreover, there is designed for the spacer layer of the (p) type (109) therein and the other spacer layer of the (p) type (111) therein to be formed for the individual optical thicknesses thereof to be as $\lambda/4$ respectively. Further, there is designed for each of the first layer of the dielectric substance (114) therein and the second layer of the dielectric substance (115) therein to be formed for the optical thicknesses in total thereof to be as approximately $\lambda/4$ as well. And then there is designed for each of such the first layer of the dielectric substance (114) therein and such the second layer of the dielectric substance (115) therein to function as the layers for the phase adjustment respectively. Furthermore, it may be available to design such the optical thicknesses in total thereof to be as approximately $\lambda/4$, as it is not limited to a case where there is designed therefor to be as exactly $\lambda/4$ for convenience' sake of such as a optical design thereof or the like. As a result, regarding such the standing wave therein, there becomes to be located a loop (AN) approximately at the active layer (105) and at an upper face of the second layer of the dielectric substance (115), that is to say, at the bottom surface of the DBR mirror at the upper side thereof (116), and meanwhile, there becomes to be located a node (N) approximately at the electrical current narrowing layer (107) and at the layer for the electrical current path of the ($p^+$) type (110) and at the contact layer of the ($p^+$) type (112) on the contrary thereto, that are shown by making use of the line (L1) therein.

Moreover, for a specific layer thickness of the first layer of the dielectric substance (114) and of the second layer of the dielectric substance (115) corresponds to the ratio of the composition, due to the index of refraction of the $SiN_x$ different from each other and corresponding to the ratio of the composition. And then in a case where the first layer of the dielectric substance (114) and the second layer of the dielectric substance (115) are formed of $SiN_x$ in which the (x) is equal to 1.5, the index of refraction (n) is defined to be 1.8. And in a case where the emission wavelength of the laser ($\lambda$) is assumed to be 1100 nm, the layer thicknesses in total of such the first layer of the dielectric substance (114) and such the second layer of the dielectric substance (115) is 1100 divided by (4 times 1.8), that is to say, approximately 152.8 nm. Or, in a case where the first layer of the dielectric substance (114) and the second layer of the dielectric substance (115) is formed of $SiN_x$ in which the (x) is equal to 1.2, the index of refraction (n) thereof is defined to be as 2.2. And then for the layer thicknesses in total of the first layer of the dielectric substance (114) and the second layer of the dielectric substance (115) is approximately 125 nm.

Next, the electrical current path in accordance with the surface emitting laser element of the vertical cavity type (100) will be described in detail below, with making use of FIG. 2. Here in accordance with the surface emitting laser element of the vertical cavity type (100), the second layer of the dielectric substance (115) is formed in order to cover the gap (121). As a result, there is no probability of erosion of the contract layer of the ($p^+$) type (112) due to a trespass of an etching reagent thereinto from the gap (121) even in a case where a process of an etching for the layer of the semiconductor such as at the process of the formation of the mesa post (M1) or the like, that will be described later. And therefore the electrical current that is injected from the electrode of the annular shape at the (p) side thereof (113) flows in parallel through both of the layer for the electrical current path of the ($p^+$) type (110) and the contact layer of the ($p^+$) type (112) that individually have the lower resistance as the electrical current paths and that is arrowed by making use of the (Ar1) as shown therein, and then thereby the resistance of the element is maintained as lower. And then the electrical current into the inner side of the electrical current injection part (107b) is narrowed due to the electrical current narrowing layer (107), and then thereby being supplied to the active layer (105) with the higher density of the electrical current. As a result, the threshold electrical current for emission from the surface emitting laser element of the vertical cavity type (100) is reduced. Moreover, it is desirable for each of the layers for the electrical current path of the ($p^+$) type (110) and the contact layer of the ($p^+$) type (112) to have a layer thickness as not thicker than 50 nm respectively, in order for both to have the individual resistance as sufficiently lower, and in order not to give any negative effect on the standing wave of the light. Furthermore, it is further preferable for both layers to have the individual layer thicknesses as between 15 nm and 30 nm.

In accordance with the surface emitting laser element of the vertical cavity type (100), the threshold electrical current for emission can be reduced because the increase of the resistance within the element is prevented.

Next, a method of manufacturing the surface emitting laser element of the vertical cavity type (100) will be described in detail below. Here each of FIG. 3 through FIG. 7 is an explanatory drawing showing one example of the method of manufacturing the surface emitting laser element of the vertical cavity type (100).

Figure 3:
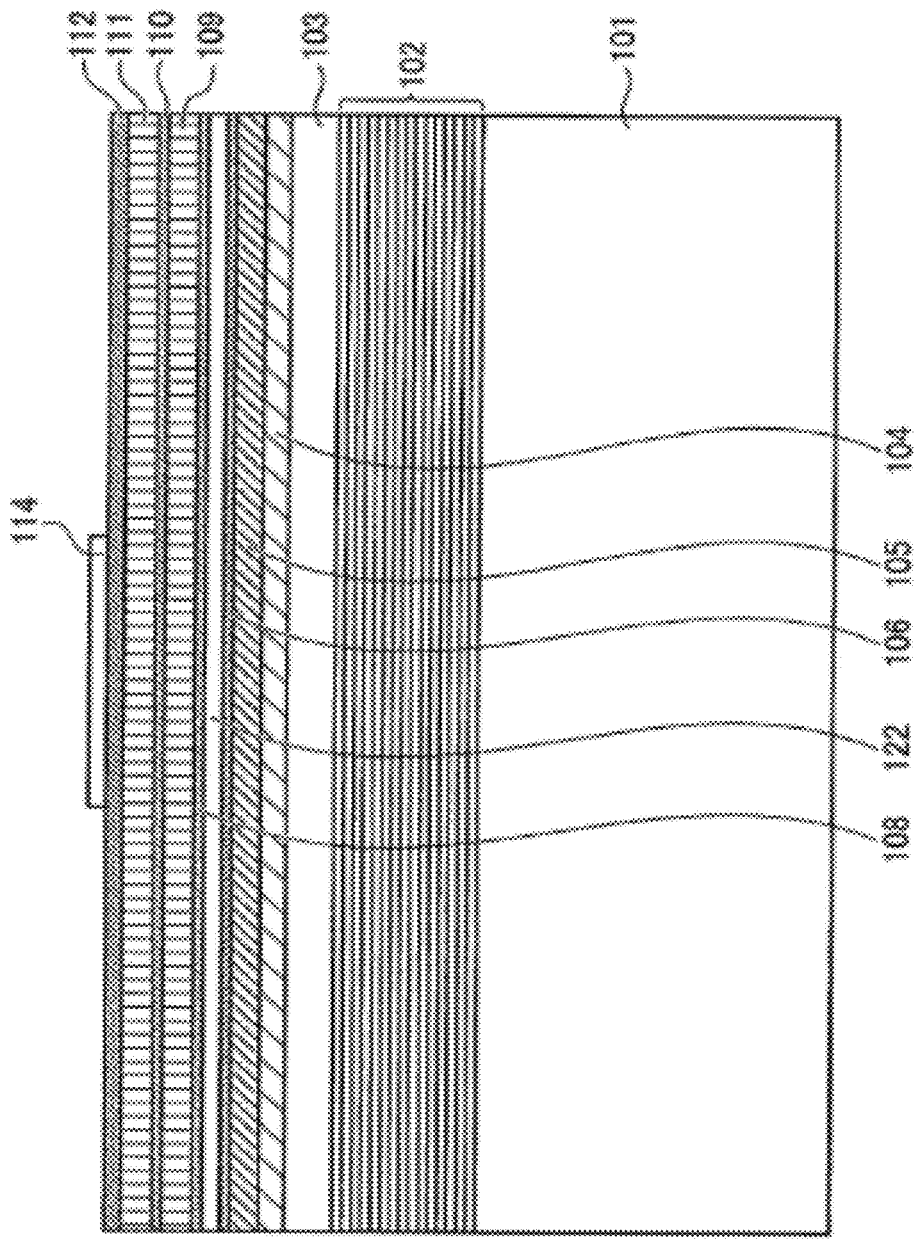
FIG. 3 is an explanatory drawing showing a method of manufacturing the surface emitting laser element of the vertical cavity type as shown in FIG. 1.

A method of an epitaxial growth for accumulations on to the substrate (101) is shown in FIG. 3: accumulating the DBR mirror at the lower side (102); accumulating the buffer layer (103); accumulating the contact layer of the (n) type (104); accumulating the active layer (105); accumulating the layer of composition to be inclined at the lower side (106); accumulating a layer to be oxidized (122) that is formed of an AlAs; accumulating the layer of composition to be inclined at the upper side (108); accumulating the spacer layer of the (p) type (109); accumulating the layer for the electrical current path of the ($p^+$) type (110); accumulating the other spacer layer of the (p) type (111); and then accumulating the contact layer of the ($p^+$) type (112). And then a process of forming the first layer of the dielectric substance (114) as the disk shape that is formed of the silicon nitride ($SiN_x$) at a part region of the contact layer of the ($p^+$) type (112) is performed by a method of chemical vapor deposition (CVD).

Figure 4:
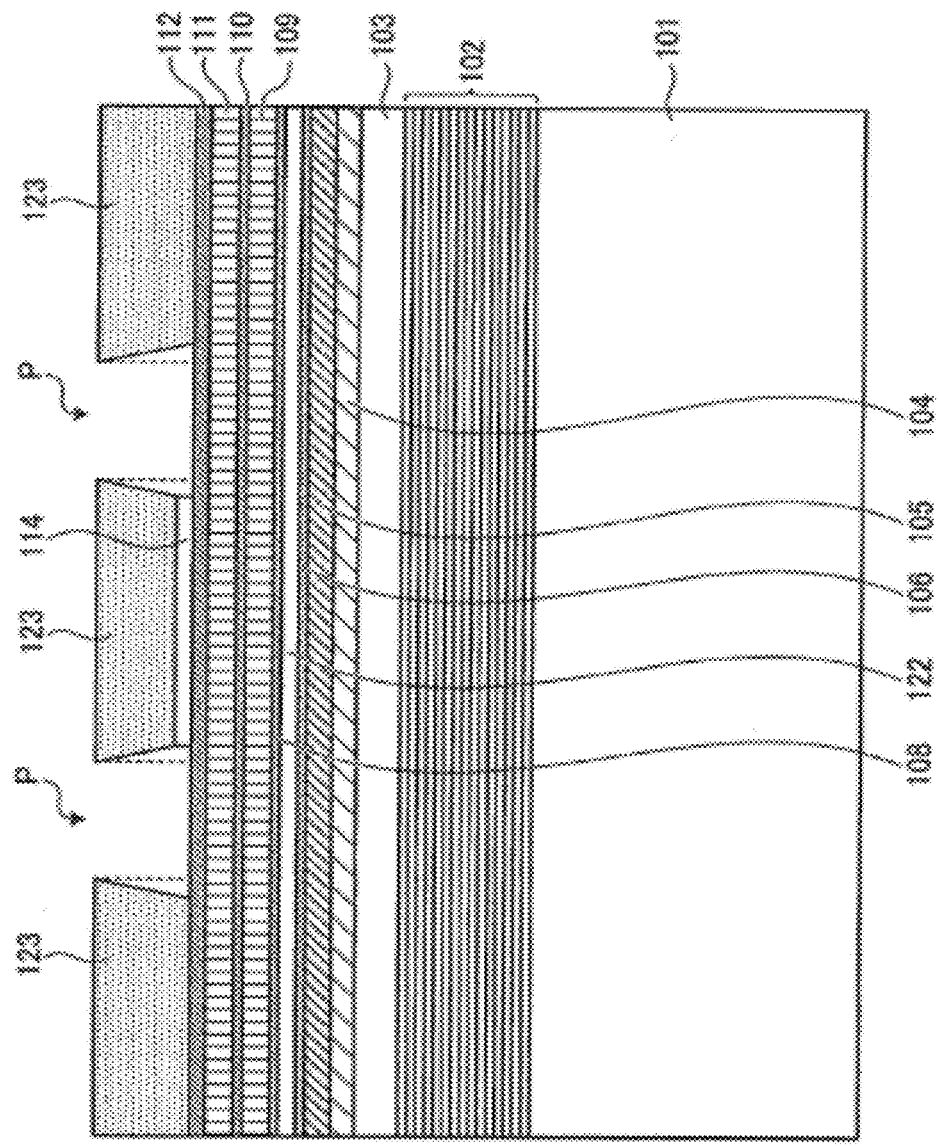
FIG. 4 is an explanatory drawing showing the method of manufacturing the surface emitting laser element of the vertical cavity type as shown in FIG. 1.

The electrode of the annular shape is formed at the (p) side (113) on to the contact layer of the ($p^+$) type (112) using a technology of a lift off, for the first layer of the dielectric substance (114) arranged at the inner side of the open part (113a). First, a process of coating a photo resist (123) of a negative type on to the first layer of the dielectric substance (114) and on to the contact layer of the ($p^+$) type (112) is performed, and then a process of forming a pattern (P) as a shape of the electrode of the annular shape at the (p) side (113) is performed, as shown in FIG. 4. Furthermore, the pattern (P) has a width as being widened corresponding to a depth from a surface of the photo resist (123) deeper at a period of the process.

Figure 5:
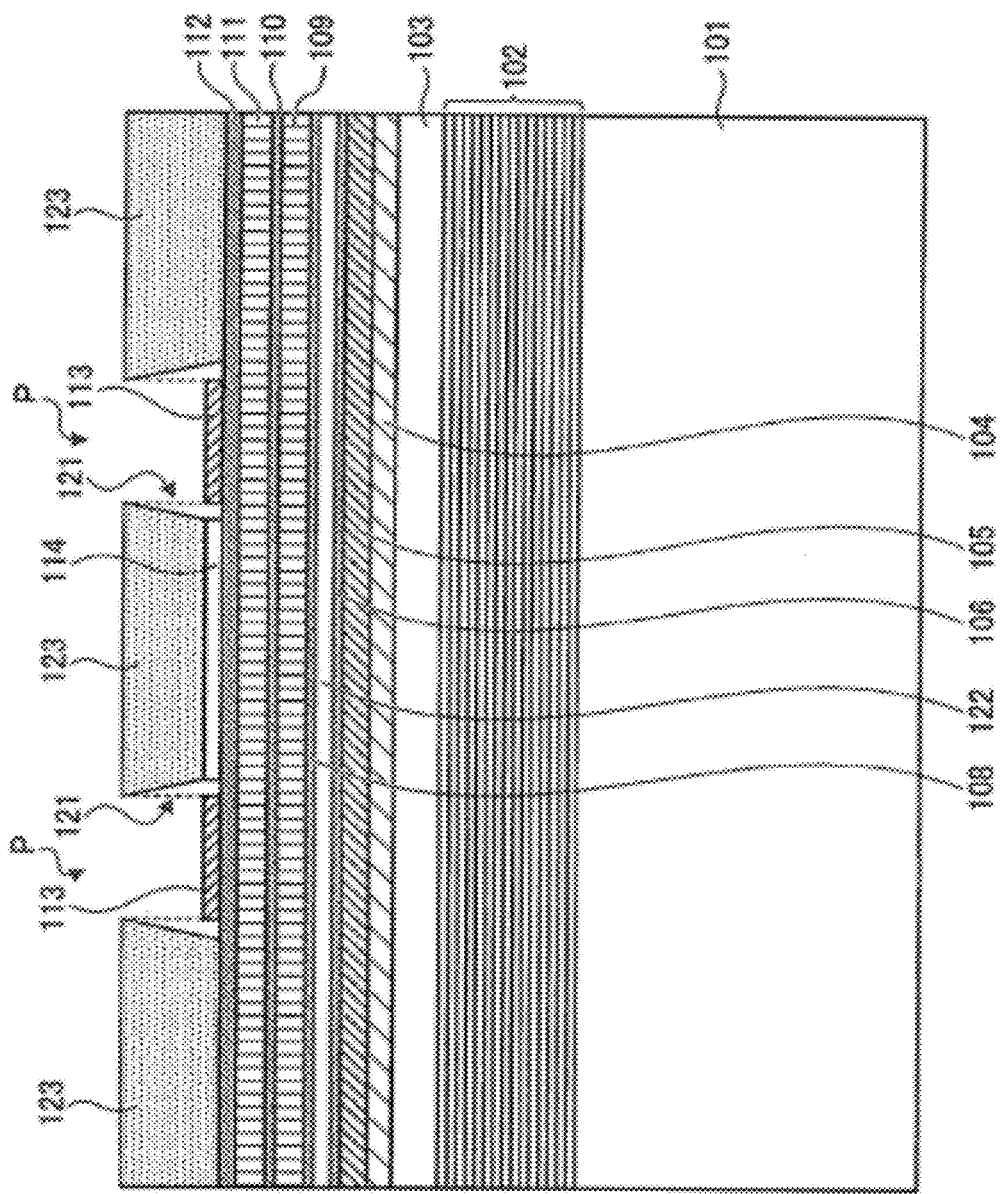
FIG. 5 is an explanatory drawing showing the method of manufacturing the surface emitting laser element of the vertical cavity type as shown in FIG. 1.

Next, a process of evaporating a layer of Ti and then a layer of Pt to have a multilayered structure of Pt/Ti from a point of view of an upper side of the photo resist (123) is performed, then a process of forming the electrode of the annular shape at the (p) side (113) on to the contact layer of the (p⁺) type (112) at the inner side of the pattern (P) is performed, that are shown in FIG. 5. And the electrode of the annular shape at the (p) side (113) is formed having a shape similar to the shape of the pattern (P) on the top surface of the photo resist (123) at a period of the process. As a result, the gap (121) is formed with a width of approximately 0.3 µm and 0.5 µm over the outer circumference of the first layer of the dielectric substance (114) between the outer circumference of the first layer of the dielectric substance (114) and the internal circumference of the electrode of the annular shape at the (p) side (113) ext, there is designed to be performed a process of evaporating a layer of Ti and then a layer of Pt to have a multilayered structure of Pt/Ti from a point of view of an upper side of the photo resist (123), and then there is performed a process of forming the electrode of the annular shape at the (p) side thereof (113) on to the contact layer of the (p⁺) type (112) at the inner side of the pattern (P), that are shown in FIG. 5. And hence there becomes to be formed such the electrode of the annular shape at the (p) side thereof (113) with having a shape as similar to the shape of the pattern (P) on the top surface of the photo resist (123) at a period of such the process thereof. As a result, there becomes to be formed the gap (121) that has the width of approximately 0.3 µm and 0.5 µm for all over the outer circumference of the first layer of the dielectric substance (114) at between such the outer circumference of the first layer of the dielectric substance (114) and the internal circumference of the electrode of the annular shape at the (p) side thereof (113).

Figure 6:
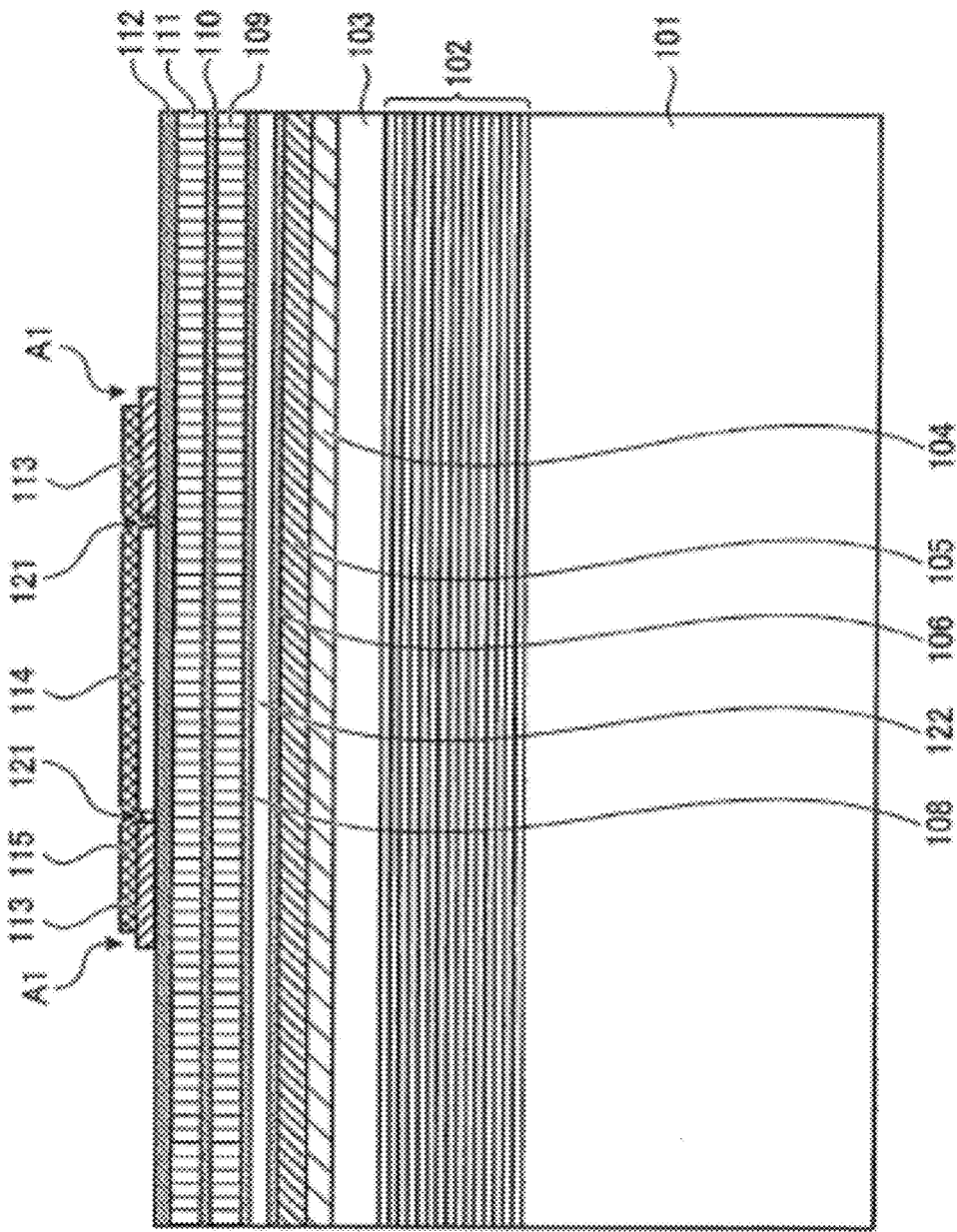
FIG. 6 is an explanatory drawing showing the method of manufacturing the surface emitting laser element of the vertical cavity type as shown in FIG. 1.

A process of forming the second layer of the dielectric substance (115) the $SiN_x$ by making use of a method of a plasma CVD in order to cover the first layer of the dielectric substance (114) and the gap (121), that is shown in FIG. 6. Moreover, the second layer of the dielectric substance (115) does not cover the whole of the surface of the electrode of the annular shape at the (p) side (113) completely at a period of the process, but formed in order to expose the region (A1) at the outer circumference of the electrode of the annular shape at the (p) side (113).

Further, the second layer of the dielectric substance (115) is formed with the optical thicknesses of the first layer of the dielectric substance (114) and the second layer of the dielectric substance (115) of approximately λ/4. Still further, the specific layer thickness of the first layer of the dielectric substance (114) and the second layer of the dielectric substance (115) are determined corresponding to the ratio of the composition, due to the index of refraction of the $SiN_x$ therein as different from each other corresponding to ratio of the composition that is described above.

Still further, there is contained some amount of hydrogen in the $SiN_x$ therein at a period of the process of generating thereof in general. And then in a case where there is smaller for the ratio of the composition (x) of such the $SiN_x$ that configures the first layer of the dielectric substance (114), there becomes to be higher for a density of such the $SiN_x$ therein. And then thereby being restricted a movement of such the hydrogen to be contained therein in a case of a later process of performing a heat treatment therefor. And hence such the hydrogen becomes to intrude into the contact layer of the (p⁺) type (112), and then thereby giving rise to a case where there may become to be increased the electrical resistance thereof. Still further, in a case where there is larger for such the ratio of the composition (x) of the $SiN_x$ therein on the contrary thereto, there becomes to be lower for a density of such the $SiN_x$ therein. As a result, it becomes easier for such the hydrogen therein to get away from the surface thereof at the period of the process of performing the heat treatment therefor. And hence there becomes to be suppressed the intrusion of such the hydrogen into the contact layer of the (p⁺) type (112), and then thereby suppressing the increase of the electrical resistance thereof as well. And therefore it is desirable for the ratio of the composition (x) of such the $SiN_x$ that configures the first layer of the dielectric substance (114) to be as larger at least at a part that is contacting to the contact layer of the (p⁺) type (112). That is to say, in a case where there is designed for the first layer of the dielectric substance (114) to comprise a configuration of a multilayered film layers for instance, it is desirable for the ratio of the composition (x) of the $SiN_x$ that configures the layer which is contacting to the contact layer of the (p⁺) type (112) to be larger comparing other layers in such the multilayered film layers therein. Still further, it is desirable for such the ratio of the composition (x) thereof to be as larger comparing to a stoichiometric composition by which the (x) is equal to 1.33. Still further, it is desirable to be designed for the concentration of the acceptors in the contact layer of the (p⁺) type (112) to be as not lower than $10^{19}$ $cm^{-3}$ and it is desirable to be designed for the concentration of such the hydrogen therein to be as not higher than $10^{18}$ $cm^{-3}$ as well even in the case where there becomes to be occurred the intrusion of such the hydrogen into such the contact layer of the (p⁺) type (112), because such the contact layer of the (p⁺) type (112) becomes to function effectively as an electrical current path therefor. Furthermore, there is no limitation in particular regarding a ratio of a composition (x) of the $SiN_x$ that configures the second layer of the dielectric substance (115) because such the second layer of the dielectric substance (115) has a face with an area as extremely smaller that contacts to the contact layer of the (p⁺) type (112). However, it is further desirable therefor to be designed as equivalent to that of the first layer of the dielectric substance (114) in particular from a point of view of an optical characteristic of such the surface emitting laser element of the vertical cavity type (100).

Figure 7:
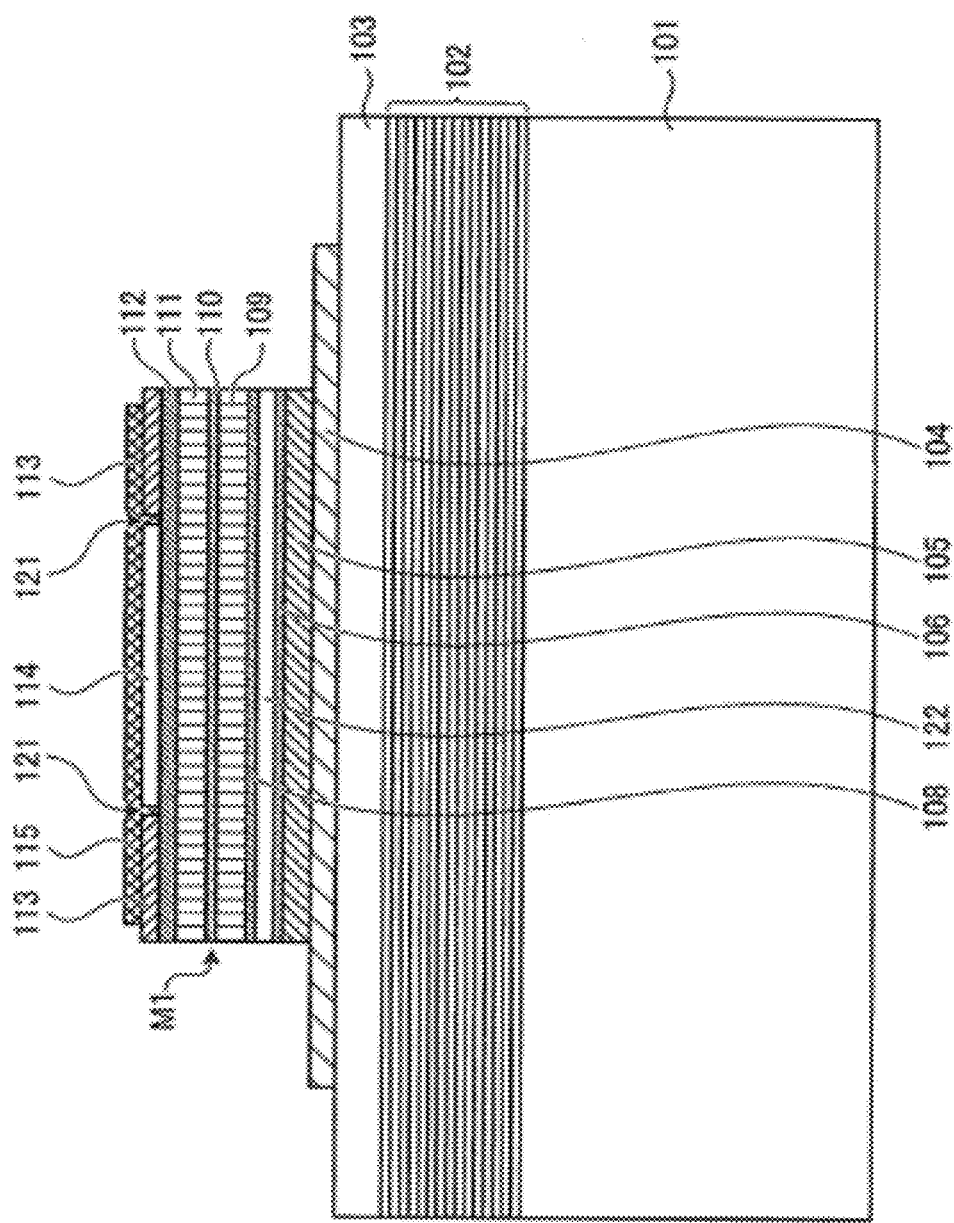
FIG. 7 is an explanatory drawing showing the method of manufacturing the surface emitting laser element of the vertical cavity type as shown in FIG. 1.

Next, following processes includes: forming the mesa post (M1) by performing a process of etching for the layer of the semiconductor to a depth for reaching to the contact layer of the (n) type (104) with making use of such as an acid etching reagent or the like and with making use of the electrode of the annular shape at the (p) side thereof (113) as a metal mask; forming another mask, and then performing a process of etching the contact layer of the (n) type (104) to a depth for reaching to the buffer layer (103). As a result, it becomes able to obtain the configuration in which there becomes to be formed the mesa post (M1) that is shown in FIG. 7. Moreover, there is designed for the second layer of the dielectric substance (115) to be formed in order to cover the gap (121). And therefore there is no probability of the occurrence of any erosion for the contract layer of the (p⁺) type (112) due to the trespass of the acid etching reagent from the gap (121) in accordance with the process of etching. Further, the second layer of the dielectric substance (115) is formed for the region (A1) at the outer circumference of the electrode of the annular shape at the (p) side (113) in order to be exposed at the period of performing the process of forming the second layer of the dielectric substance (115). And there is no probability of the occurrence of any protruding of the outer circumference of the second layer of the dielectric substance (115) from the outer circumference of the electrode of the annular shape at the (p) side (113). As a result, the outer circumference of the electrode of the annular shape at the (p) side (113) and the outer circumference of the mesa post (M1) match with each other with a high accuracy.

Next, a processes includes: performing a process of a heat treatment in a water vapour atmosphere; and then performing a process of a selective oxidation for the layer to be oxidized (122) from the side of the outer circumference of the mesa post (M1). And then a chemical reaction of ($4AlAs+6H_2O \rightarrow 2Al_2O_3+4AsH_3$) occurs in the layer to be oxidized (122). And then the AlAs therein is oxidized to $Al_2O_3$ from a side of an outer circumference of the layer to be oxidized (122), and the electrical current narrowing part (107a) is formed. Moreover, chemical reaction progresses uniformly from the side of the outer circumference of the layer to be oxidized (122). And hence the electrical current injection part (107b) is formed of AlAs at the center is formed. Further, the electrical current injection part (107b) has a diameter of approximately between 6 μm and 7 μm, by performing a control of an amount of time for performing the process of the heat treatment or the like. And then because of the electrical current injection part (107b) a center of such the mesa post (M1) and a center of the electrical current injection part (107b) and for a center of the open part (113a) of the electrode of the annular shape at the (p) side (113) match with each other in a higher accuracy. As a result, a surface emitting laser element of the vertical cavity type (100) can be a laser having a single transverse mode with a higher yield rate of manufacturing.

Further, $AsH_3$ which is generated due to the chemical reaction that is mentioned above is dispersed and undergoes a chemical reaction of ($Pt+2AsH_3 \rightarrow PtAs_2+3H_2$) with the Pt which is contained in the electrode of the annular shape at the (p) side (113) at the region (A1) that is the exposed part of the electrode of the annular shape at the (p) side (113). As a result, a deterioration of the electrode of the annular shape at the (p) side occurs at the region (A1) that is the exposed part, and increases the electrical resistance. Other regions that are covered by the second layer of the dielectric substance (115) are protected from the deterioration, and then maintain a lower electrical resistance.

Next, a process of forming the electrode at the (n) side (117) in a half annular shape on the surface of the contact layer of the (n) type (104) at the side of the outer circumference of the mesa post (M1). The passivation film layer (118) is formed on to whole of the surface of the electrode. Moreover, each of the open parts at the passivation film layer (118) and at the second layer of the dielectric substance (115) are formed on the electrode at the (n) side (117) and on the electrode of the annular shape at the (p) side (113) respectively. Furthermore, the electrode is formed at the (n) side (119) and contacted to the electrode at the (n) side (117) and the electrode is formed at the (p) side (120) that is contacted to the electrode of the annular shape at the (p) side (113), via each of such the open parts thereon respectively.

Next, a process of forming the DBR mirror at the upper side thereof (116) by making use of the method of the CVD is described. Also described is a process of polishing a rear surface of the substrate (101), and adjusting the thickness of the substrate (101) to be as approximately 150 μm, for instance. Moreover, there described a process of separating the element from each other. And hence the surface emitting laser element of the vertical cavity type (100) that is shown in FIG. 1 is completed.

Next, a surface emitting laser element of the vertical cavity type that has a configuration as shown in FIG. 1 is manufactured in accordance with the method of manufacturing which is described above. The method involves a substance having a ratio of a composition (x) for which the (x) is equal to 1.33 (Example 1) and of another substance with having a ratio of a composition (x) for which the (x) is equal to 1.5 (Example 2) for each of the $SiN_x$ that individually configure the first layer of the dielectric substance and the second layer of the dielectric substance respectively. While, as a comparative example, there is performed another surface emitting laser element of the vertical cavity type is manufactured according to a method of manufacturing similar to the method of manufacturing that is described above, however, in which a first layer of a dielectric substance is formed of the $SiN_x$ for which the (x) is equal to 1.33 and that has an optical thickness of $\lambda/4$, and without forming a second layer of a dielectric substance.

Moreover, a resistance of each of the elements is measured in accordance with the individual surface emitting laser elements of the vertical cavity type. A resistance of 100Ω was obtained for the element in accordance with the comparative example, meanwhile, a resistance of was obtained for the element in accordance with Example 1, and a resistance of 80Ω was obtained for the element in accordance with Example 2. That is to say, the second layer of the dielectric substance in the element in accordance with Example 1 prevents the contact layer of the ($p^+$) type from the occurrence of any erosion, and, as a result, reducing the resistance of the element compared to the resistance of an element in accordance with the comparative example in which a second layer of dielectric substance is not formed. Further, with regard to the element in accordance with Example 2 when erosion is prevented, hydrogen which is contained in the first layer of the dielectric substance and/or in the second layer of the dielectric substance is prevented from intruding into the contact layer of the ($p^+$) type, further reducing the resistance of the element. Furthermore, other advantages include improving a property of an impedance matching regarding a high frequency property and of releasing a limitation of a band due to a capacitance component and a resistance component (CR) and the like from each of such the surface emitting laser elements of the vertical cavity type in accordance with Example 1 and Example 2 that are individually caused due to a reflection of the reducing of the resistance of each of the elements.

The Second Embodiment

Next, a surface emitting laser element of a vertical cavity type regarding the second embodiment in accordance with the present invention will be described in detail below. The surface emitting laser element of the vertical cavity type in accordance with the present second embodiment has an emission wavelength of a laser in a band of 1100 nm, which is similar to that of the surface emitting laser element of the vertical cavity type in accordance with the first embodiment. However, there is a point that there is designed for a second layer of a dielectric substance to be a part of a reflecting mirror of a multilayered film layer at an upper side thereof, which is different from that in accordance with the first embodiment.

Figure 8:
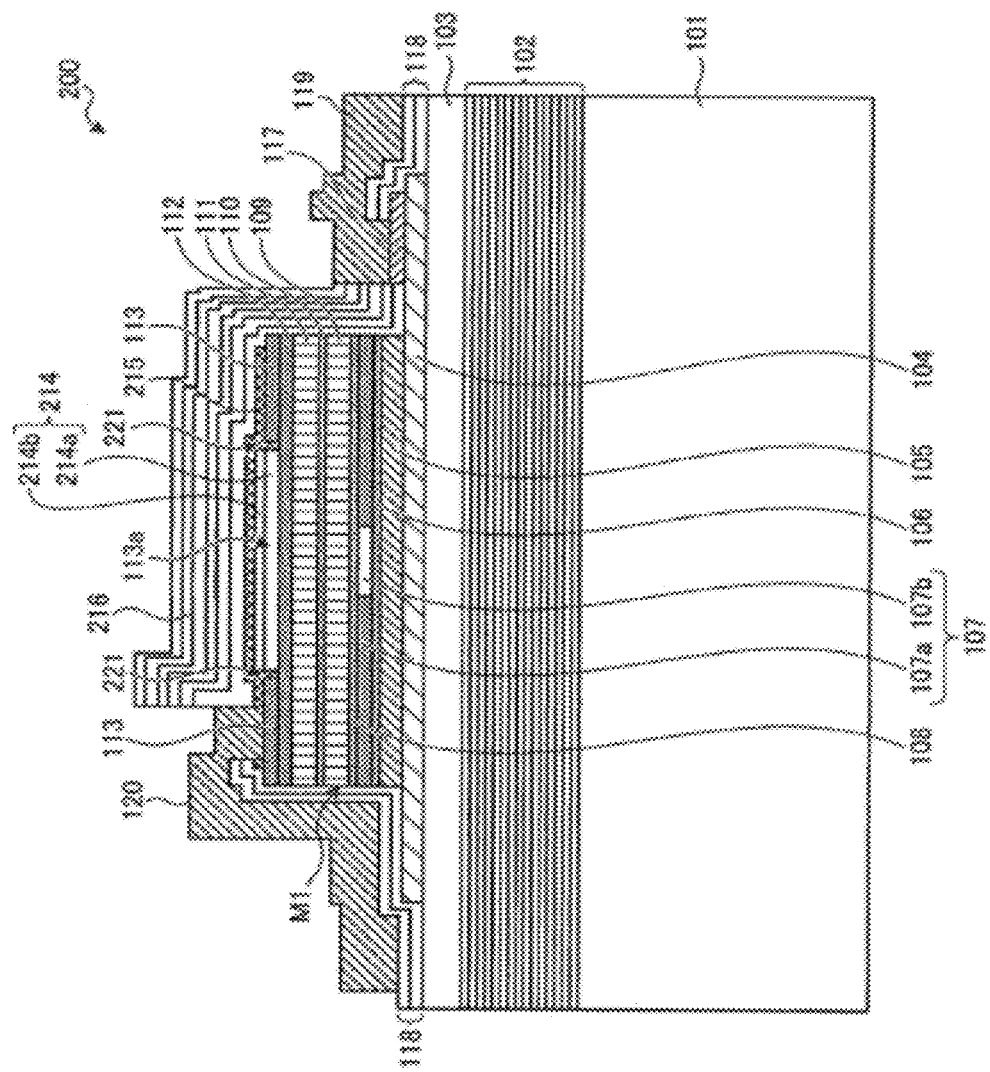
FIG. 8 is a cross sectional view exemplary showing a surface emitting laser element of a vertical cavity type regarding the second embodiment in accordance with the present invention.

FIG. 8 is a cross sectional view showing an exemplary surface emitting laser element of a vertical cavity type (200) regarding the second embodiment making use of a same symbol for a part as in accordance with the surface emitting laser element of the vertical cavity type (100) that is shown in FIG. 1. Further, the surface emitting laser element of the vertical cavity type (200) has a configuration that is almost similar to that in accordance with the surface emitting laser element of the vertical cavity type (100). However, a first layer of a dielectric substance (214) has a disk shape that is formed at the inner side of the open part (113a) of the electrode of the annular shape at the (p) side (113) to comprise a configuration of a multilayered film layers structure in which a layer of a dielectric substance is accumulated at a lower side (214a) that is formed of an $SiN_x$ and a layer of a dielectric substance at an upper side (214b) that is accumulated on to the layer of the dielectric substance at the lower side (214a) and formed of $SiO_2$, that are different from that in accordance with the surface emitting laser element of the vertical cavity type (100). Furthermore, the layer of the dielectric substance at the lower side (214a) is formed for an optical thickness of approximately $\lambda/4$.

Moreover, a gap (221) is formed with a width of approximately between 0.3 μm and 0.5 μm for an outer circumference of the first layer of the dielectric substance (214) at between the outer circumference of the first layer of the dielectric substance (214) and the internal circumference of the electrode of the annular shape at the (p) side (113). Further, a second layer of a dielectric substrate (215) is formed of an $SiN_x$ in order to cover the first layer of the dielectric substance (214) and the gap (221), and then for an outer circumference thereof in order to reach on to the electrode of the annular shape at the (p) side (113).

Still further, a multilayered film layer at an upper side thereof (216) is formed of a dielectric substance over the part from the second layer of the dielectric substrate (215) to the outer circumference of the mesa post (M1). Furthermore, the multilayered film layer at the upper side thereof (216) is comprised of a multilayered structure of $SiN_x/SiO_2$ between ten and twelve pairs, for instance.

Figure 9:
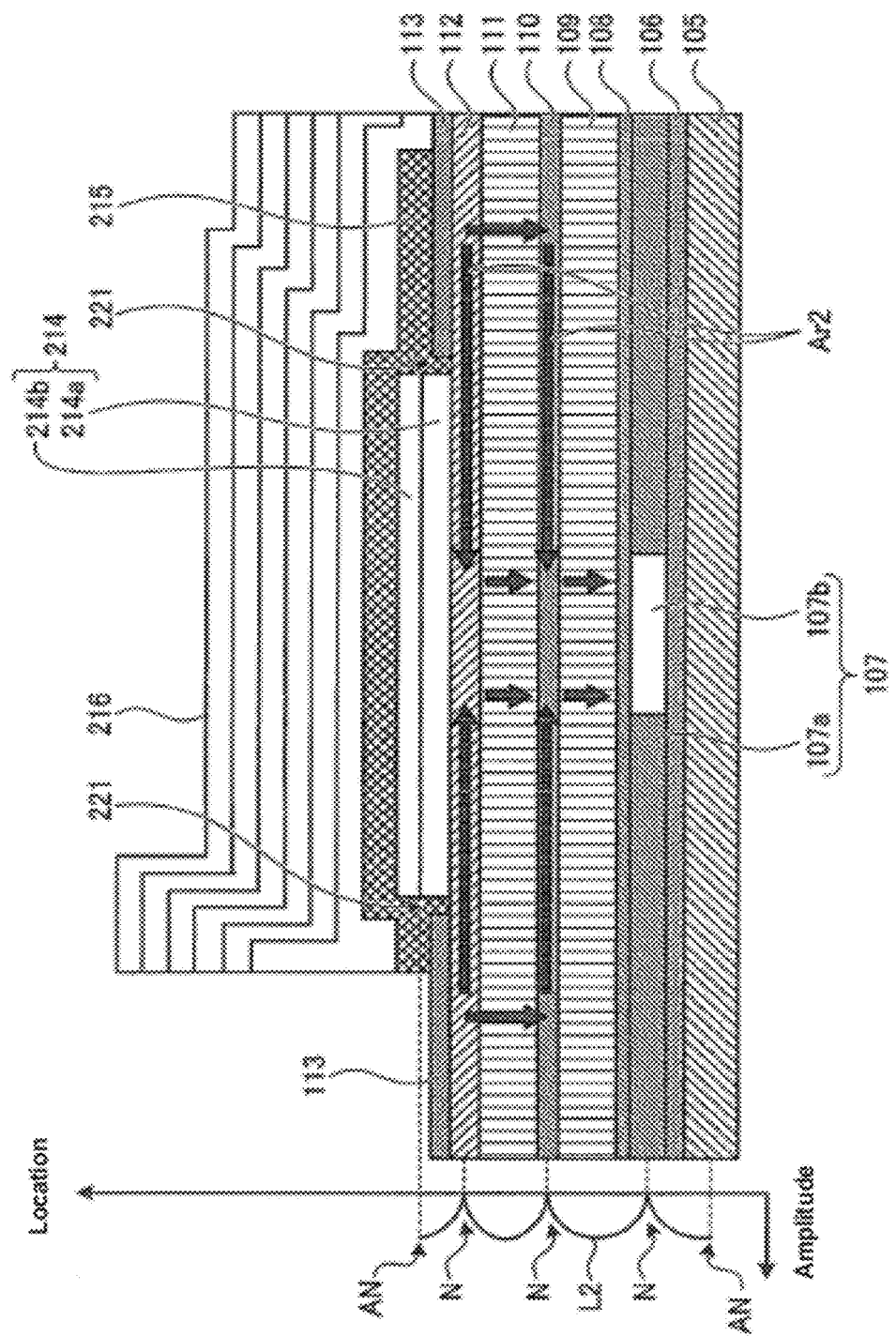
FIG. 9 is an explanatory drawing showing a standing wave of a light and an electrical current path in accordance with the surface emitting laser element of the vertical cavity type as shown in FIG. 8.
Figure 10:
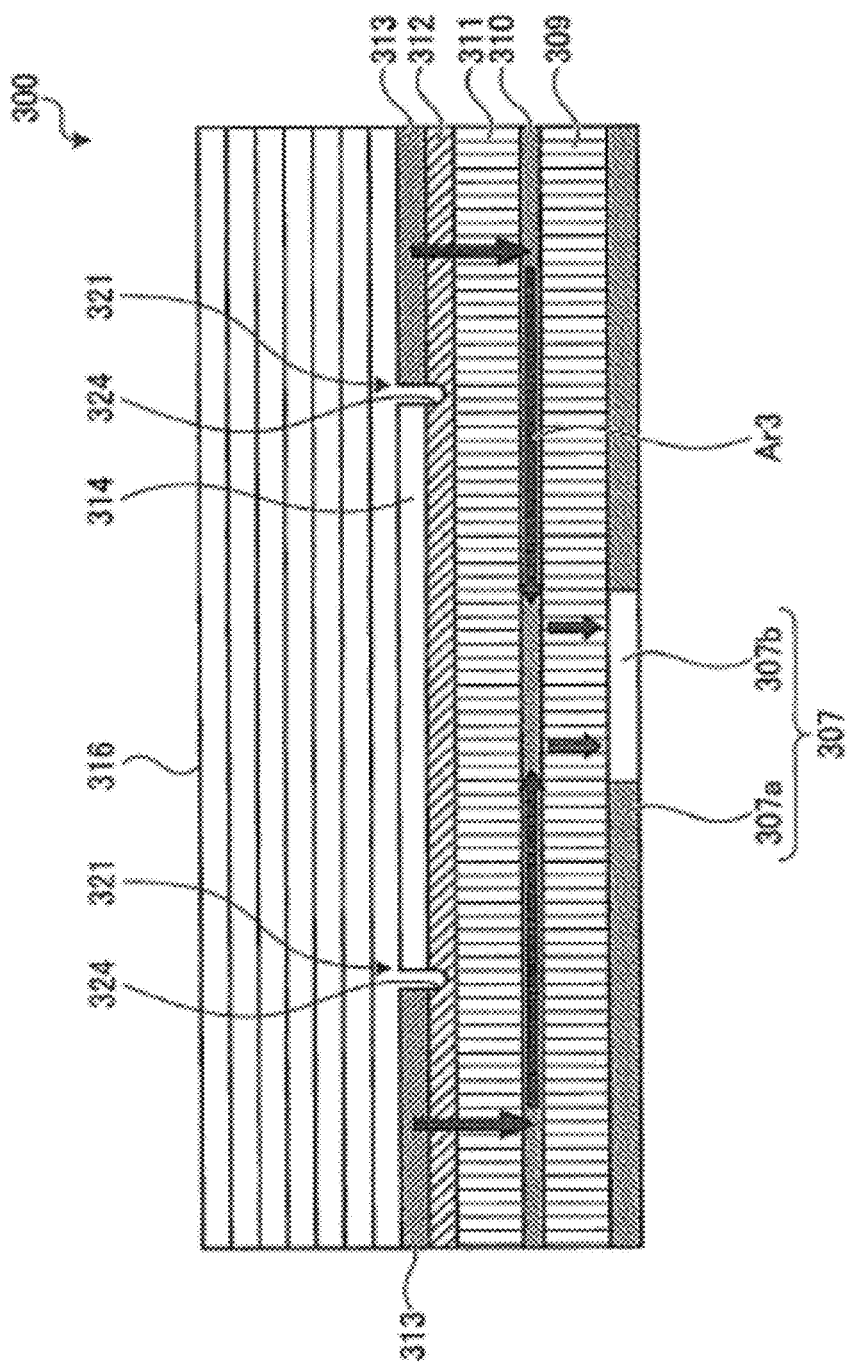
FIG. 10 is a cross sectional view exemplary showing a principal part of a surface emitting laser element of a vertical cavity type that has a conventional configuration.

Next, the standing wave of the light and the electrical current path in accordance with the surface emitting laser element of the vertical cavity type (200) will be described in detail below. Here FIG. 9 is an explanatory drawing showing the standing wave of the light and the electrical current path in accordance with the surface emitting laser element of the vertical cavity type (200).

First, the standing wave of the light in accordance with the surface emitting laser element of the vertical cavity type (200) will be described in detail below. Here in accordance with FIG. 9, a line (L2) indicates a location in a multilayered structure from the active layer (105) through the second layer of the dielectric substance (215), and the same indicates an amplitude of the standing wave at each of the locations therein respectively. Moreover, the layer of the dielectric substance at the upper side thereof (214b) and the second layer of the dielectric substrate (215) and the multilayered film layer at the upper side thereof (216) in accordance with such the surface emitting laser element of the vertical cavity type (200) to comprise a DBR mirror at an upper side thereof, and then there is designed for a lower face of the layer of the dielectric substance at the upper side thereof (214b) to be as a bottom surface of such the DBR mirror at the upper side thereof. That is to say, the layer of the dielectric substance at the upper side thereof (214b) and for the second layer of the dielectric substrate (215) to configure one pair of a bottom part of such the DBR mirror at the upper side thereof. Further, there is designed for the layer of the dielectric substance at the lower side thereof (214a) formed for the optical thicknesses thereof to be approximately $\lambda/4$, and to function as the layer for the phase adjustment. As a result, regarding the standing wave, there a loop (AN) is located approximately at the active layer (105) and at the lower face of the layer of the dielectric substance at the upper side thereof (214b), that is to say, at the bottom surface of the DBR mirror at the upper side thereof, meanwhile, a node (N) is located approximately at the electrical current narrowing layer (107) and at the layer for the electrical current path of the ($p^+$) type (110) and at the contact layer of the ($p^+$) type (112) on the contrary thereto, that are shown by making use of the line (L2).

Next, the electrical current path in accordance with the surface emitting laser element of the vertical cavity type (200) will be described in detail below. Here in accordance with such the surface emitting laser element of the vertical cavity type (200), there is designed for the second layer of the dielectric substance (215) to be formed in order to cover the gap (221). As a result, the electrical current that is injected from the electrode of the annular shape at the (p) side (113) flows in parallel through both of the layer for the electrical current path of the ($p^+$) type (110) and the contact layer of the ($p^+$) type (112) that individually have a lower resistance of the electrical current paths and that is arrowed by making use of the (Ar2) as shown therein, and the resistance of the element is lower. As a result, the threshold electrical current for emission from the surface emitting laser element of the vertical cavity type (200) is reduced.

Furthermore, the surface emitting laser element of the vertical cavity type (200) can be manufactured according to a method similar to the method of manufacturing the surface emitting laser element of the vertical cavity type (100) that is described above.

The surface emitting laser element of the vertical cavity type (200) can have a reduced threshold electrical current for emission therefrom due to a prevention against the increase of the resistance of the element.

Moreover, the AlAs for the layer to be oxidized in accordance with each of the embodiments that are described above, however, there may be an $Al_{1-x}Ga_xAs$ (0<x<1). And the layer is oxidized to be formed of the $Al_{1-x}Ga_xAs$, there becomes an electrical current narrowing part in such electrical current narrowing layer to be formed of an $(Al_{1-x}Ga_x)_2O_3$ and for an electrical current injection part to be formed of the $Al_{1-x}Ga_xAs$.

Further, the electrode of the annular shape at the (p) side is formed by the method of the lift off in accordance with each of the embodiments that are described above, however, there is not limited in particular regarding a method of performing the formation of such the electrode of the annular shape at the (p) side. And an electrode of an annular shape at a (p) side using any other method, a gap formed between the electrode of the annular shape at the (p) side and a first layer of a dielectric substance due to a difference of the materials from each other. And therefore the present invention can obtain the advantages.

Furthermore, the layers for the electrical current path include the contact layer formed as two layers in accordance with each of the embodiments that are described above, however, it is able to obtain the advantages in accordance with the present invention even in a case where such a layer for an electrical current path to be comprised of only a contact layer, or in the other case comprised of not less than three layers.

Although the invention has been described with respect to specific embodiments for a complete and clear disclosure, appended claims are not to be thus limited but are to be construed as embodying all modifications and alternative constructions that may occur to one skilled in the art that fairly fall within the basic teaching herein set forth.

What is claimed is:

1. A method of manufacturing a surface emitting laser element of a vertical cavity type, comprising the steps of:
   sequentially accumulating a multilayered reflecting mirror and a plurality of semiconductor layers on a substrate, the plurality of semiconductor layers comprising an active layer, an ohmic contact layer that has a first dopant density and a conductivity type, and a spacer layer formed between the active layer and the ohmic contact layer that has a second dopant density that is less than the first dopant density and the conductivity type, the accumulating further comprising forming an electrical current narrowing layer that comprises an electrical current narrowing part and an electrical current injection part that is located substantially at a center of the electrical current narrowing part;

forming a first dielectric layer on the ohmic contact layer, wherein a diameter of the electrical current injection part is smaller than a diameter of the first dielectric layer;

forming an electrode on the ohmic contact layer, an open part of the electrode being substantially at a center of the ohmic contact layer, and the first dielectric layer being arranged at an inner side of the open part of the electrode;

forming a second dielectric layer covering the first dielectric layer and covering a gap which is formed between the first dielectric layer and the electrode, the second dielectric layer being a layer that is present in the manufactured surface emitting laser element;

etching the plurality of semiconductor layers and forming a mesa post that is accumulated on the semiconductor, wherein the electrode is a mask of the mesa post, wherein the forming the second dielectric layer occurs prior to the etching of the plurality of semiconductor layers;

forming a second multilayered reflecting mirror above the second dielectric layer by accumulating a multilayered film that is formed of a dielectric substance, after forming the mesa post, wherein the first dielectric layer comprises a multilayered structure of a fourth dielectric layer on a lower side and a fifth dielectric layer on an upper side, and the fourth dielectric layer has optical thickness of approximately $\lambda/4$, where $\lambda$ is a preferred emission wavelength of a laser.

2. The method of manufacturing the surface emitting laser element of the vertical cavity type according to claim 1, wherein the accumulating further comprises accumulating a layer to be oxidized that is formed of an AlAs or an $Al_{1-x}Ga_xAs$ (0<x<1) between the ohmic contact layer and the active layer, and wherein the forming the electrical current narrowing layer that comprises the electrical current injection part further comprising forming the electrical current injection part of AlAs or $Al_{1-x}Ga_xAs$ and forming the electrical current narrowing part of $Al_2O_3$ or $(Al_{1-x}Ga_x)_2O_3$, by performing a selective oxidizing heat treatment that is performed after the formation of the mesa post.

3. The method of manufacturing the surface emitting laser element of the vertical cavity type according to claim 2, wherein the accumulating further comprises accumulating a layer for an electrical current path in between the ohmic contact layer and the layer to be oxidized, that has a concentration of an acceptor which is approximately equivalent to the concentration of the acceptor in the ohmic contact layer.

4. The method of manufacturing the surface emitting laser element of the vertical cavity type according to claim 1, wherein at least a part of the first dielectric layer that contacts the ohmic contact layer is formed of silicon nitride that has a higher composition ratio of nitrogen than the rest of the first dielectric layer.

5. A surface emitting laser element of the vertical cavity type, comprising:

a substrate;

a multilayered reflecting minor that is accumulated on the substrate;

a plurality of semiconductor layers accumulated on the multilayered reflecting mirror, the plurality of semiconductor layers comprising:
a structure of a mesa post,
an active layer,
an ohmic contact layer on a top of the plurality of semiconductor layers, wherein the ohmic contact layer has a conductivity type and a first dopant density, wherein the ohmic contact layer has an outer circumference corresponding to an outer circumference of the structure of the mesa post, and
a spacer layer formed between the active layer and the ohmic contact later, wherein the spacer layer has the conductivity type and a second dopant density, wherein the second dopant density is lower than the first dopant density, wherein the ohmic contact layer is formed on the spacer layer;

an electrode that is formed on the ohmic contact layer, an open part of the electrode being substantially at a center of the ohmic contact layer;

a first dielectric layer on the ohmic contact layer at an inner side of the open part of the electrode;

a second dielectric layer that covers the first dielectric layer covering a gap that is formed between the first dielectric layer and the electrode, wherein the second dielectric layer is formed before the structure of the mesa post is formed and is present in the manufactured surface emitting laser element;

an electrical current narrowing layer comprising an electrical current narrowing part and an electrical current injection part that is located substantially at a center of the electrical current narrowing part, wherein a diameter of the electrical current narrowing part is smaller than a diameter of the first dielectric layer;

a multilayered film that is formed on the second dielectric layer, wherein the multilayered film is formed of a dielectric substance, wherein the first dielectric layer comprises a multilayered structure of a fourth dielectric layer at a lower side and a fifth dielectric layer at an upper side, and the fourth dielectric layer at the lower side has an optical thickness of approximately $\lambda/4$ when a preferred emission wavelength of a laser is ($\lambda$), and the multilayered film and the fifth dielectric layer configure a second multilayered reflecting mirror, in which the fifth dielectric layer at the upper side is also a bottom layer.

6. The surface emitting laser element of the vertical cavity type according to claim 5, wherein the electrical current injection part is formed of an AlAs or an $Al_{1-x}Ga_xAs$ (0<x<1) and the electrical current narrowing part is formed of an $Al_2O_3$ or an $(Al_{1-x}Ga_x)_2O_3$, that are formed by a selective oxidizing heat treatment between the active layer and the ohmic contact layer.

7. The surface emitting laser element of the vertical cavity type according to claim 6, wherein the layers of the semiconductor provide a layer for an electrical current path between the electrical current narrowing layer and the ohmic contact layer, that has a concentration of an acceptor that is approximately equivalent to a concentration of the acceptor in the ohmic contact layer.

8. The surface emitting laser element of the vertical cavity type according to claim 5, wherein at least a part of the first dielectric layer that contacts the ohmic contact layer is formed of a silicon nitride which has a higher composition ratio of nitrogen than the rest of the first dielectric layer.

9. The surface emitting laser element of the vertical cavity type according to claim 5, wherein the ohmic contact layer is not thicker than 50 nm, the concentration of an acceptor is not lower than $10^{19}$ cm$^{-3}$, and a concentration of hydrogen is not higher than $10^{18}$ cm$^{-3}$.

* * * * *